US008803622B1

(12) United States Patent
Yan et al.

(10) Patent No.: US 8,803,622 B1
(45) Date of Patent: Aug. 12, 2014

(54) MICROELECTROMECHANICAL-BASED OSCILLATORS HAVING ADJUSTABLE GAIN AMPLIFIERS THEREIN THAT SUPPORT Q-FACTOR CONTROL

(71) Applicant: Integrated Device Technology, Inc., San Jose, CA (US)

(72) Inventors: Minhui Yan, San Jose, CA (US); Chien-Chen Chen, San Jose, CA (US); Harmeet Bhugra, San Jose, CA (US)

(73) Assignee: Integrated Device Technology, Inc, San Jose, CA (US)

( * ) Notice: Subject to any disclaimer, the term of this patent is extended or adjusted under 35 U.S.C. 154(b) by 74 days.

(21) Appl. No.: 13/629,732

(22) Filed: Sep. 28, 2012

(51) Int. Cl.
 *H03B 5/36* (2006.01)

(52) U.S. Cl.
 USPC ...................................... 331/116 M; 331/154

(58) Field of Classification Search
 USPC ............................................. 331/116 M, 154
 See application file for complete search history.

(56) References Cited

U.S. PATENT DOCUMENTS

| | | | |
|---|---|---|---|
| 7,307,486 B2 | 12/2007 | Pernia et al. | |
| 7,545,227 B2 | 6/2009 | Pernia et al. | |
| 7,545,231 B2 | 6/2009 | McCorquodale et al. | |
| 7,639,105 B2 | 12/2009 | Ayazi et al. | |
| 7,800,282 B2 | 9/2010 | Ayazi et al. | |
| 7,843,284 B2 | 11/2010 | Ayazi et al. | |
| 7,888,843 B2 | 2/2011 | Ayazi et al. | |
| 7,924,119 B1 | 4/2011 | Ayazi et al. | |
| 7,939,990 B2 | 5/2011 | Wang et al. | |
| 8,022,779 B2 * | 9/2011 | Ayazi et al. | 331/154 |
| 8,093,958 B2 | 1/2012 | O'Day et al. | |
| 8,228,130 B1 | 7/2012 | Ivanov et al. | |
| 8,456,250 B2 * | 6/2013 | Locascio et al. | 331/107 A |
| 8,525,605 B2 * | 9/2013 | Yamakawa et al. | 331/154 |
| 2007/0115073 A1 * | 5/2007 | Rohde et al. | 331/185 |

* cited by examiner

*Primary Examiner* — Joseph Chang
(74) *Attorney, Agent, or Firm* — Myers, Bigel, et al.

(57) ABSTRACT

Oscillator circuits include a MEMs resonator, a variable impedance circuit (e.g., varistor) and an adjustable gain amplifier. The variable impedance circuit includes a first terminal electrically coupled to a first terminal of the MEMs resonator and the adjustable gain amplifier is electrically coupled to the variable impedance circuit. The adjustable gain amplifier may have an input terminal electrically coupled to the variable impedance circuit and a second terminal of the MEMs resonator may receive, as feedback, a signal derived from an output of the adjustable gain amplifier. A Q-factor control circuit may be provided, which is configured to drive the variable impedance circuit and the adjustable gain amplifier with first and second control signals, respectively, that cause an impedance of the variable impedance circuit and a gain of the adjustable gain amplifier to be relatively high during a start-up time interval and relatively low during a post start-up time interval.

16 Claims, 7 Drawing Sheets

MICROELECTROMECHANICAL-BASED OSCILLATORS HAVING ADJUSTABLE GAIN AMPLIFIERS THEREIN THAT SUPPORT Q-FACTOR CONTROL

FIELD OF THE INVENTION

The present invention relates to integrated circuit devices and, more particularly, to microelectromechanical-based oscillator circuits.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMs) resonators can provide small form factor, ease of integration with conventional semiconductor fabrication techniques and high f·Q products. Accordingly, MEMs resonators are considered a desirable alternative to quartz resonators in real-time and other clock applications.

One example of a MEMs resonator includes lateral-mode piezoelectric resonators, such as thin-film piezoelectric-on-silicon (TPoS) resonators, which have been successfully incorporated into low-power and low-noise oscillators. Some examples of these types of resonators are disclosed in U.S. Pat. No. 7,939,990 to Wang et al., entitled "Thin-Film Bulk Acoustic Resonators Having Perforated Bodies That Provide Reduced Susceptibility to Process-Induced Lateral Dimension Variations," and in U.S. Pat. No. 7,888,843 to Ayazi et al., entitled "Thin-Film Piezoelectric-on-Insulator Resonators Having Perforated Resonator Bodies Therein," the disclosures of which are hereby incorporated herein by reference. Unfortunately, frequency tuning has not been studied extensively in these types of resonators.

Active frequency tuning techniques that include application of a DC voltage on the piezoelectric layer have been demonstrated, but such tuning typically requires relatively large voltages, which may be incompatible with the low operating voltages of conventional oscillator circuits. Some examples of active frequency tuning in micromechanical resonators are disclosed in U.S. Pat. Nos. 7,639,105 and 7,843,284 to Ayazi et al., entitled "Lithographically-Defined Multi-Standard Multi-Frequency High-Q Tunable Micromechanical Resonators," and in U.S. Pat. No. 7,924,119 to Ayazi et al., entitled Micromechanical Bulk Acoustic Mode Resonators Having Interdigitated Electrodes and Multiple Pairs of Anchor Supports," and in U.S. Pat. No. 7,800,282 to Ayazi et al., entitled Single-Resonator Dual-Frequency Lateral-Extension Mode Piezoelectric Oscillators, and Operating Methods Thereof," the disclosures of which are hereby incorporated herein by reference. Based on limitations of active frequency tuning, cost effective passive tuning techniques have been considered. Examples of MEMs-based oscillators that utilize passive tuning are disclosed in U.S. application Ser. No. 13/175,445, filed Jul. 1, 2011, and Ser. No. 13/494,535, filed Jun. 12, 2012, the disclosures of which are hereby incorporated herein by reference. In addition, because the start-up times of MEMs-based resonators are typically relatively long on the order of milliseconds, techniques are required to reduce start-up times of oscillators containing MEMs-based resonators to the level of microseconds.

SUMMARY OF THE INVENTION

Microelectromechanical-based oscillator circuits according to embodiments of the invention include a microelectromechanical resonator (e.g., MEMs resonator), a variable impedance circuit (e.g., varistor) and an adjustable gain amplifier. The variable impedance circuit includes a first terminal electrically coupled to a first terminal of the microelectromechanical resonator and the adjustable gain amplifier is electrically coupled to the variable impedance circuit. In particular, the adjustable gain amplifier may have an input terminal electrically coupled to the variable impedance circuit and a second terminal of the microelectromechanical resonator may receive, as feedback, a signal derived from an output of the adjustable gain amplifier.

According to some embodiments of the invention, the adjustable gain amplifier may have an input terminal electrically coupled a second terminal of the variable impedance circuit. However, according to alternative embodiments of the invention, the adjustable gain amplifier may have an input terminal electrically coupled the first terminal of the variable impedance circuit and the second terminal of the microelectromechanical resonator may be electrically coupled to a second terminal of the variable impedance circuit and the output of the adjustable gain amplifier.

According to additional embodiments of the invention, a Q-factor control circuit is electrically coupled to the variable impedance circuit and the adjustable gain amplifier. This Q-factor control circuit is configured to drive the variable impedance circuit and the adjustable gain amplifier with first and second control signals, respectively, which cause an impedance of the variable impedance circuit and a gain of the adjustable gain amplifier to be relatively high during a start-up time interval and relatively low during a post start-up time interval. This Q-factor control circuit may also include an amplitude detector having a first input terminal responsive to the signal derived from an output of the adjustable gain amplifier and a second input terminal responsive to a reference voltage. In some embodiments of the invention, the amplitude detector may be configured to switch an output thereof from a first logic state to a second logic state in response to detecting an increase in magnitude of the signal derived from an output of the adjustable gain amplifier beyond a magnitude of the reference voltage. The start-up time interval and the post start-up time interval may be consecutive time intervals corresponding to when the output of the amplitude detector is in the first and second logic states, respectively. For example, the start-up and post start-up time intervals may be immediately consecutive time intervals.

According to additional embodiments of the invention, the Q-factor control circuit may be alternatively configured to drive the variable impedance circuit and the adjustable gain amplifier with first and second control signals, respectively, that cause a gain of the adjustable gain amplifier to be relatively high during a start-up time interval and relatively low during a post start-up time interval and possibly vice versa for the variable impedance circuit. This Q-factor control circuit may also include an amplitude detector having a first input terminal responsive to the signal derived from an output of the adjustable gain amplifier and a second input terminal responsive to a reference voltage. This amplitude detector may be configured to switch an output thereof from a first logic state to a second logic state in response to detecting an increase in magnitude of the signal derived from an output of the adjustable gain amplifier beyond a magnitude of the reference voltage. The start-up time interval and the post start-up time intervals may be immediately consecutive time intervals corresponding to when the output of the amplitude detector is in the first and second logic states, respectively.

DETAILED DESCRIPTION OF EMBODIMENTS

Figure 1A:
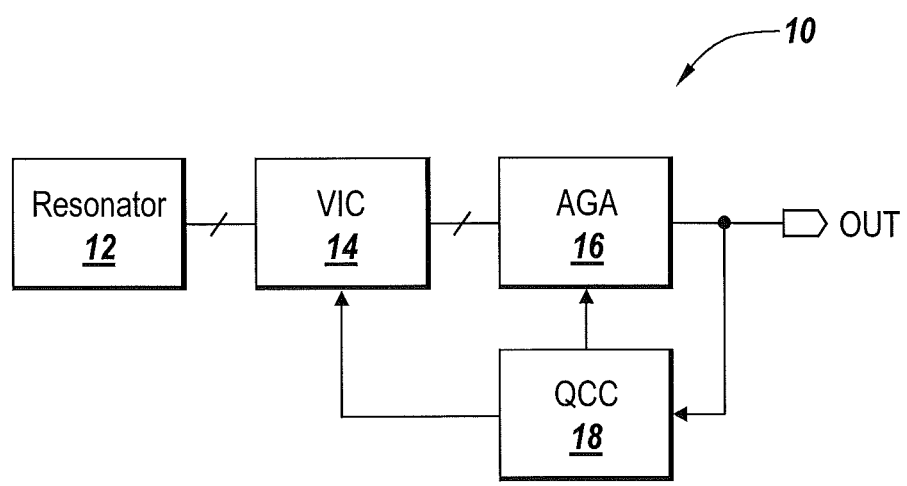
FIG. 1A is a block diagram of an oscillator circuit according to an embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 1A, an oscillator circuit 10 according to an embodiment of the present invention is illustrated as including a resonator 12, which is electrically coupled to a variable impedance circuit (VIC) 14 and an adjustable gain amplifier (AGA) 16. The resonator 12 may be characterized as supporting a relatively high quality factor (Q) that may be varied during start-up and post start-up time intervals. According to some embodiments of the invention, the resonator 12 may be a microelectromechanical (MEMs) resonator. As further illustrated by FIG. 1A, the variable impedance circuit 14 and adjustable gain amplifier 16 are responsive to respective control signals generated by a Q-factor control circuit (QCC) 18, which operates to adjust a Q-factor of the oscillator circuit 10 by controlling an impedance and gain of the variable impedance circuit 14 and adjustable gain amplifier 16, respectively, in response to a signal generated at an output (OUT).

Figure 1B:
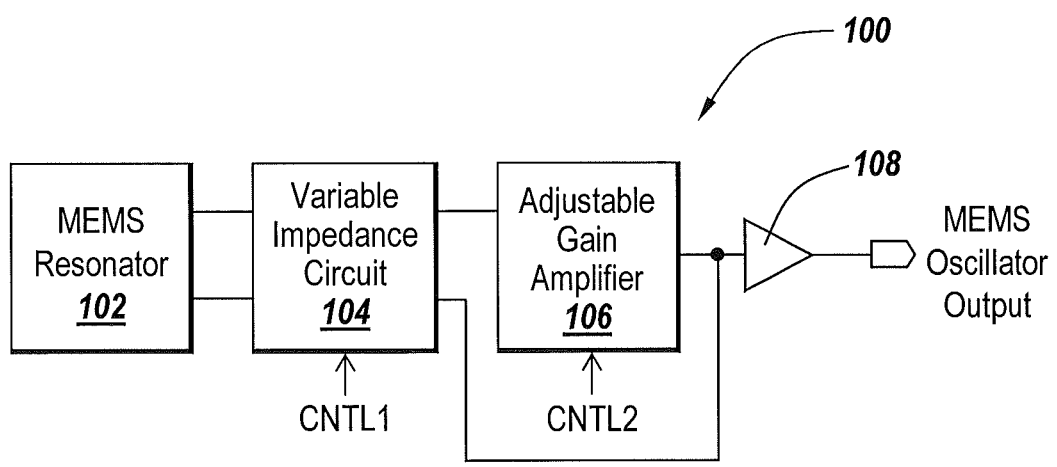
FIG. 1B is a block diagram of a microelectromechanical-based oscillator circuit according to an embodiment of the invention.
Figure 1C:
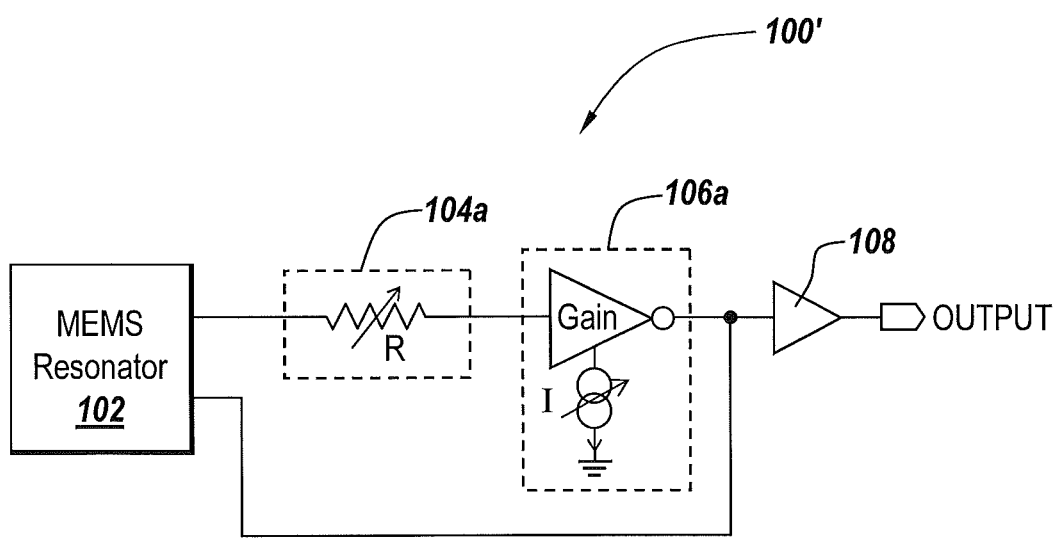
FIG. 1C is an electrical schematic of a microelectromechanical-based oscillator circuit according to an embodiment of the invention.
Figure 1D:
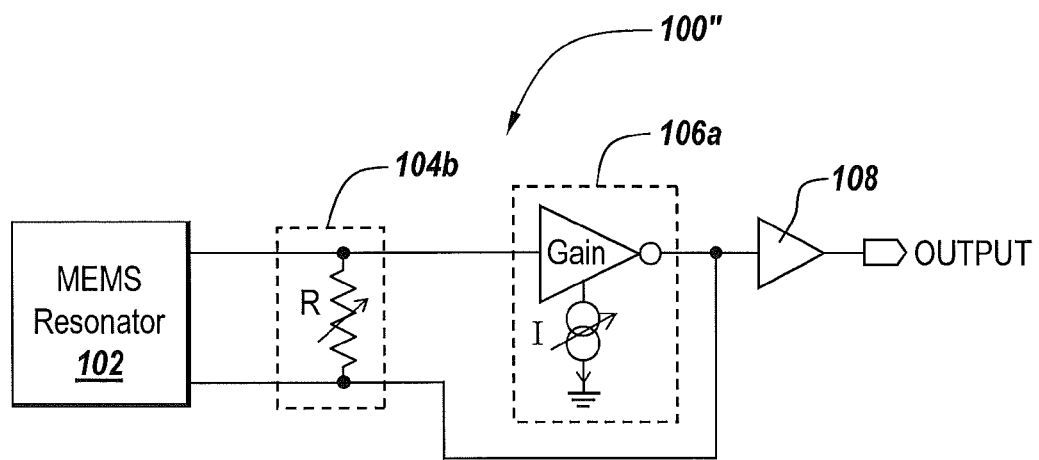
FIG. 1D is an electrical schematic of a microelectromechanical-based oscillator circuit according to an embodiment of the invention.

One embodiment of the oscillator circuit 10 of FIG. 1A is illustrated by the microelectromechanical-based oscillator circuit 100 of FIG. 1B, which includes a microelectromechanical resonator 102 (e.g., two-port MEMs resonator), a variable impedance circuit 104, an adjustable gain amplifier 106 and an output buffer 108, connected as illustrated. This oscillator circuit 100 may be configured in both single and multiple chip embodiments. In a multiple chip embodiment, the MEMs resonator 102 may be embodied in a separate chip relative to the variable impedance circuit 104, the adjustable gain amplifier 106 and buffer 108. As shown by the FIG. 1B, the variable impedance circuit 104 is responsive to a first control signal (CNTL1), which operates to modulate impedance, and the adjustable gain amplifier is responsive to a second control signal (CNTL2), which operates to modulate gain, as described more fully hereinbelow. One embodiment of the MEMs-based oscillator circuit 100 of FIG. 1B is illustrated by the oscillator circuit 100' of FIG. 1C, which includes a series-connected varistor 104a and an inverting amplifier 106a with variable gain provided by a variable current source I. As shown by FIG. 1C, the series-connected varistor 104a has a first current carrying terminal electrically connected to a first terminal of the MEMs resonator 102 and a second current carrying terminal electrically connected to an input terminal of the inverting amplifier 106a. The output terminal of the inverting amplifier 106a is electrically connected to an input terminal of the output buffer 108 and a second terminal of the MEMs resonator 102. Another embodiment of the MEMs-based oscillator circuit 100 of FIG. 1B is illustrated by the oscillator circuit 100" of FIG. 1D, which includes a parallel-connected varistor 104b and an inverting amplifier 106a with variable gain provided by a variable current source I. As shown by FIG. 1D, the parallel-connected varistor 104b has first and second current carrying terminals electrically connected to first and second terminals of the MEMs resonator 102, respectively. The first and second current carrying terminals of the parallel-connected varistor 104b are also connected to input and output terminals of the inverting amplifier 106a.

Figure 2:
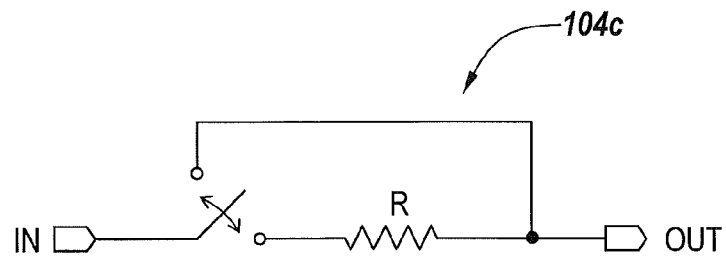
FIG. 2 is a digital variable impedance circuit (VIC) according to an embodiment of the present invention.
Figure 3A:
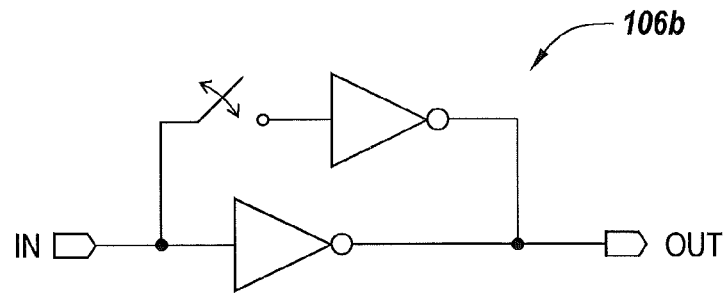
FIGS. 3A-3B are examples of adjustable gain amplifiers (AGA) according to embodiments of the present invention.
Figure 3B:
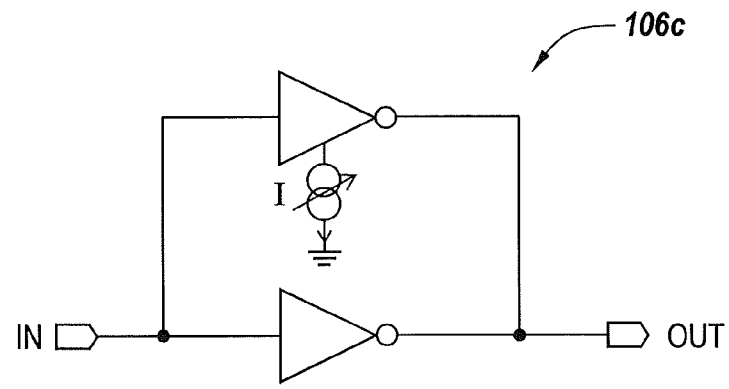

According to some embodiments of the invention, the series-connected varistor 104a of FIG. 1C may be simply implemented as a resistor circuit 104c having two resistance states that are controlled by a digital control signal (e.g., 1 or 0), as shown by FIG. 2. Similarly, the adjustable gain amplifier 106a of FIG. 1C may be simply implemented as a pair of parallel-connected amplifiers 106b that are controlled by a digital control signal (e.g., 1 or 0), as shown by FIG. 3A. Alternatively, the adjustable gain amplifier 106a of FIG. 1C may be implemented as a pair of fixed gain and variable gain inverting amplifiers 106c, as shown by FIG. 3B.

Figure 4A:
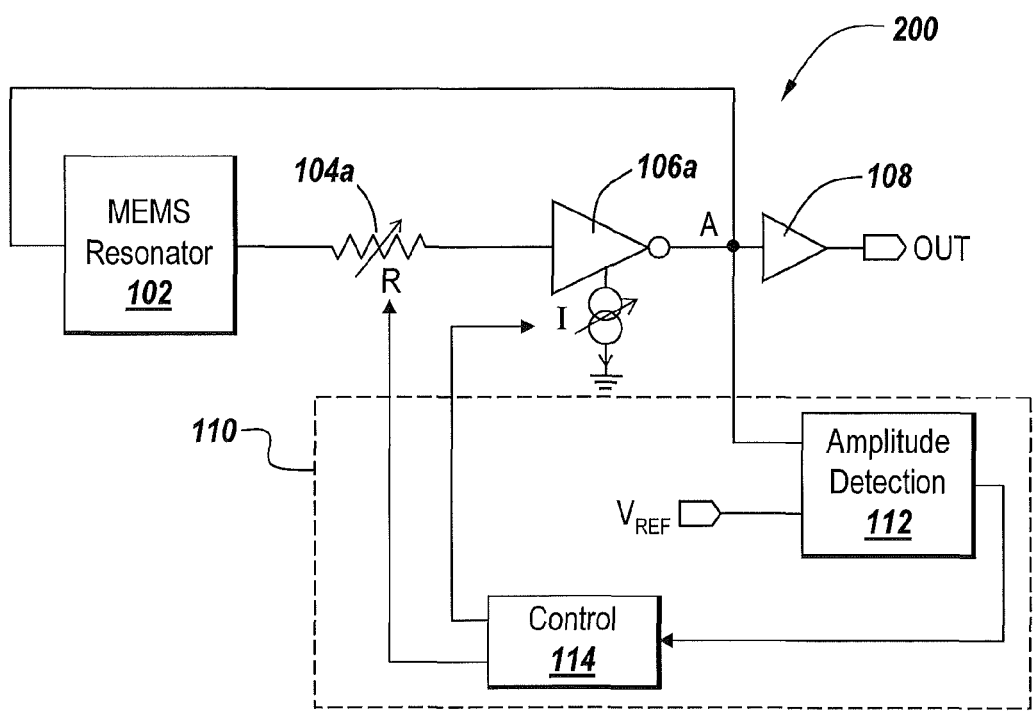
FIG. 4A is an electrical schematic of a microelectromechanical-based oscillator circuit with Q-factor control, according to an embodiment of the invention.

FIG. 4A illustrates a microelectromechanical-based oscillator circuit 200, which is similar to the oscillator circuit of FIG. 1C, but includes illustration of an embodiment of a Q-factor control circuit 110. This Q-factor control circuit 110 is shown as including an amplitude detector 112 and a control unit 114, connected as illustrated. As described more fully hereinbelow with respect to FIG. 4B, the Q-factor control circuit 110 operates to reduce a Q-factor of the oscillator circuit 200 during a start-up time interval by generating control signals (e.g., CNTL1, CNTL2) that cause a series resistance of the varistor 104a to be relatively high and a gain of the adjustable gain amplifier 106a to be relatively high to thereby provide sufficient oscillator loop gain to compensate for the high series loop impedance. Thereafter, the Q-factor control circuit 110 operates to allow the Q-factor of the oscillator circuit 200 to increase during a post start-up time interval (e.g., to reflect the high Q-factor characteristics of the MEMs resonator 102). This increase is achieved because the Q-factor control circuit 110 generates control signals that cause a series resistance of the varistor 104a to be relatively low and a gain of the adjustable gain amplifier 106a to be relatively low once proper operation of the oscillator circuit 200 has been achieved at the conclusion of the start-up time interval. This transition point in the operation of the oscillator circuit 200 may be identified using an amplitude detector 112 that compares a magnitude of a voltage at output node A against a predetermined reference voltage $V_{REF}$. Based on this comparison, an output of the amplitude detector 112 can switch logic states, which the control unit 114 identifies as a point at which the resistance and gain of the varistor 104a and amplifier 106a, respectively, must change to enable a ratio of the energy stored in the oscillator circuit 200 to the energy lost per oscillation cycle to increase.

Figure 4B:
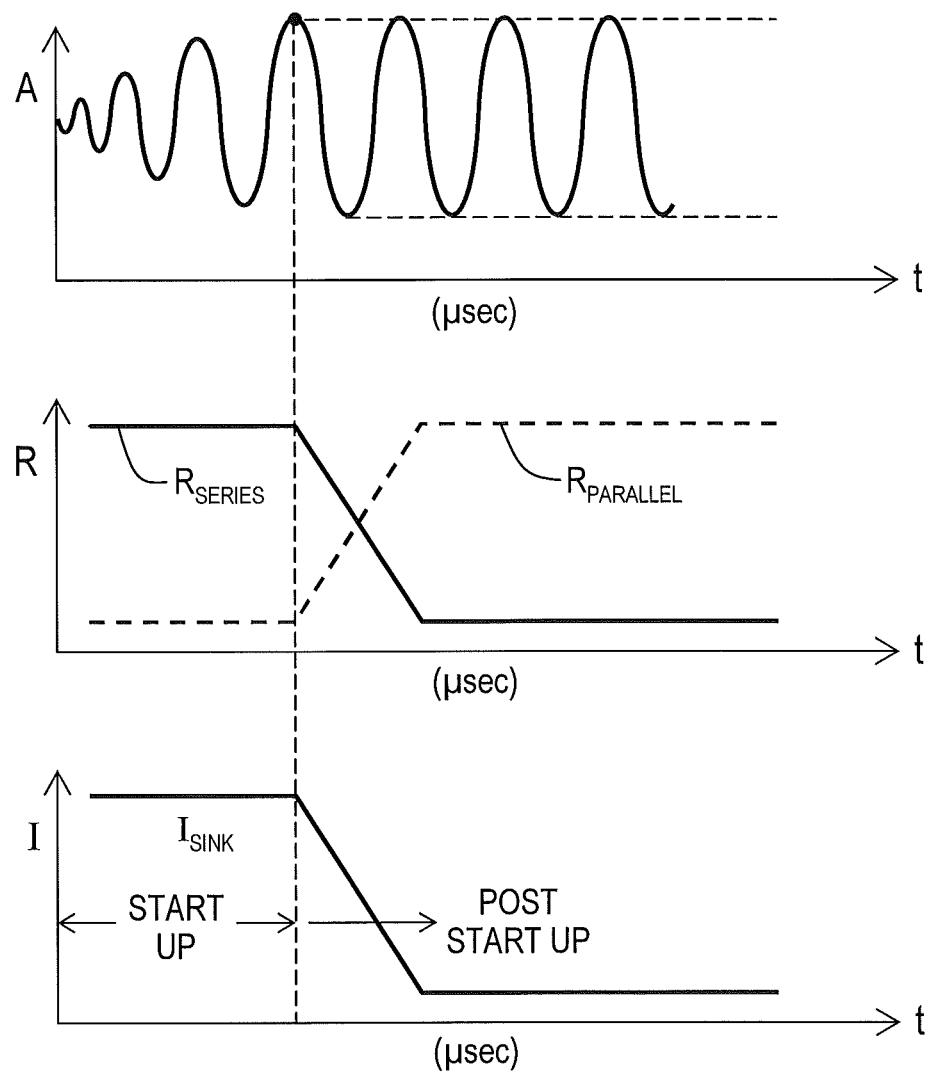
FIG. 4B are graphs that illustrate operation of the microelectromechanical-based oscillator circuit of FIG. 4A.

During the start-up (i.e., power-up) and post start-up time intervals illustrated by FIG. 4B, the voltage at output node A illustrated by FIG. 4A undergoes a per cycle ramp up in amplitude until a desired reference voltage (e.g., $V_{REF}$) is reached. Upon reaching the desired reference voltage, the control unit 114 within the Q-factor control circuit 110 ramps down the resistance provided by the series varistor 104a and ramps down the pull-down current I (i.e., sink current) of the adjustable gain amplifier 106a, to thereby lower the power consumption requirements of the oscillator circuit 200 and increase its quality of resonance (i.e., Q-factor). Alternatively, as shown by FIG. 1D and the dotted line in FIG. 4B, the parallel resistance of the varistor 104b may undergo an increase upon transition from the start-up time interval to the post start-up time interval.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A microelectromechanical-based oscillator circuit, comprising:
   a microelectromechanical resonator having first and second terminals;
   a variable impedance circuit having a first terminal electrically coupled to the first terminal of said microelectromechanical resonator; and
   an adjustable gain amplifier electrically coupled to said variable impedance circuit, said adjustable gain amplifier having an input terminal electrically coupled a second terminal of said variable impedance circuit.

2. The oscillator circuit of claim 1, wherein the second terminal of said microelectromechanical resonator receives as feedback a signal derived from an output of said adjustable gain amplifier.

3. A microelectromechanical-based oscillator circuit, comprising:
   a microelectromechanical resonator having first and second terminals;
   a variable impedance circuit having a first terminal electrically coupled to the first terminal of said microelectromechanical resonator;
   an adjustable gain amplifier electrically coupled to said variable impedance circuit; and
   a Q-factor control circuit electrically coupled to said variable impedance circuit and said adjustable gain amplifier, said Q-factor control circuit configured to drive said variable impedance circuit and said adjustable gain amplifier with first and second control signals, respectively, that cause a gain of said adjustable gain amplifier to be relatively high during a start-up time interval and relatively low during a post start-up time interval.

4. The oscillator circuit of claim 3, wherein the first control signal causes an impedance of said variable impedance circuit to be relatively low during the start-up time interval and relatively high during the post start-up time interval.

5. The oscillator circuit of claim 4, wherein said Q-factor control circuit comprises an amplitude detector having a first input terminal responsive to the signal derived from an output of said adjustable gain amplifier and a second input terminal responsive to a reference voltage.

6. The oscillator circuit of claim 5, wherein said amplitude detector is configured to switch an output thereof from a first logic state to a second logic state in response to detecting an increase in magnitude of the signal derived from an output of said adjustable gain amplifier beyond a magnitude of the reference voltage.

7. The oscillator circuit of claim 6, wherein the start-up time interval and the post start-up time intervals are consecutive time intervals corresponding to when the output of said amplitude detector is in the first and second logic states, respectively.

8. The oscillator circuit of claim 7, wherein the start-up time interval and the post start-up time intervals are immediately consecutive time intervals.

9. The oscillator circuit of claim 3, wherein said adjustable gain amplifier has an input terminal electrically coupled the first terminal of said variable impedance circuit; and wherein the second terminal of said microelectromechanical resonator is electrically coupled to a second terminal of said variable impedance circuit.

10. The oscillator circuit of claim 9, wherein the second terminal of said microelectromechanical resonator is electrically connected to the output of said adjustable gain amplifier.

11. The oscillator circuit of claim 3, wherein the first control signal causes
an impedance of said variable impedance circuit to be relatively high during the start-up time interval and relatively low during the post start-up time interval.

12. The oscillator circuit of claim 3, wherein said Q-factor control circuit comprises an amplitude detector having a first input terminal responsive to the signal derived from an output of said adjustable gain amplifier and a second input terminal responsive to a reference voltage.

13. The oscillator circuit of claim 12, wherein said amplitude detector is configured to switch an output thereof from a first logic state to a second logic state in response to detecting an increase in magnitude of the signal derived from an output of said adjustable gain amplifier beyond a magnitude of the reference voltage.

14. The oscillator circuit of claim 13, wherein the start-up time interval and the post start-up time interval are consecutive time intervals corresponding to when the output of said amplitude detector is in the first and second logic states, respectively.

15. The oscillator of claim 3, wherein said variable impedance circuit is a varistor.

16. A microelectromechanical-based oscillator circuit, comprising:
a microelectromechanical resonator, a variable impedance device and an adjustable gain amplifier configured in a loop so that the adjustable gain amplifier provides a feedback signal to said microelectromechanical resonator; and
a Q-factor control circuit configured to:
drive the adjustable gain amplifier with a first control signal that causes a gain of said adjustable gain amplifier to be relatively high during a start-up time interval when a Q-factor of the oscillator circuit is relatively low and relatively low during a post start-up time interval when the Q-factor of the oscillator circuit is relatively high; and
drive the variable impedance device with a second control signal that causes an impedance of the variable impedance circuit to be relatively high (low) during the start-up time interval and relatively low (high) during the post start-up time interval, which follows the start-up time interval.

* * * * *